US006576399B1

(12) United States Patent
Gries et al.

(10) Patent No.: US 6,576,399 B1
(45) Date of Patent: Jun. 10, 2003

(54) RADIATION-SENSITIVE RECORDING MATERIAL FOR THE PRODUCTION OF WATERLESS OFFSET PRINTING PLATES

(75) Inventors: Willi-Kurt Gries, Mainz (DE); Hans-Joachim Schlosser, Wiesbaden (DE)

(73) Assignee: AGFA-Gevaert N.V., Mortsel (BE)

( * ) Notice: Subject to any disclaimer, the term of this patent is extended or adjusted under 35 U.S.C. 154(b) by 0 days.

(21) Appl. No.: 09/504,952

(22) Filed: Feb. 16, 2000

(30) Foreign Application Priority Data

Feb. 26, 1999 (DE) ........................................ 199 08 528

(51) Int. Cl.[7] .................................................. G03F 7/11
(52) U.S. Cl. .................................... 430/272.1; 430/303
(58) Field of Search ............................... 430/272.1, 303

(56) References Cited

U.S. PATENT DOCUMENTS

| | | | | | |
|---|---|---|---|---|---|
| 4,769,308 | A | * | 9/1988 | Hiruma et al. | 430/272.1 |
| 4,853,313 | A | * | 8/1989 | Mori et al. | 430/156 |
| 4,861,698 | A | | 8/1989 | Hiruma et al. | 430/272.1 |
| 5,503,074 | A | * | 4/1996 | Hirano et al. | 430/303 |

FOREIGN PATENT DOCUMENTS

| | | |
|---|---|---|
| CA | 1050805 | 3/1979 |
| DE | 25 12 038 | 10/1975 |
| EP | 0 755 781 | 1/1997 |
| EP | 0 763 424 | 3/1997 |
| EP | 0 764 522 | 3/1997 |
| EP | 0764 522 | 3/1997 |
| EP | 0 802 067 | 10/1997 |
| EP | 0 897 795 | 2/1999 |
| WO | 97/00175 | 1/1997 |
| WO | 98/31550 | 7/1998 |

OTHER PUBLICATIONS

Ebewele, Robert O., Polymer Science and Technology, CRC Press LLC, Boca Raton, Florida, 1996, pp. 460–461 and 413.*

Alger, Mark S.M., Polymer Science Dictionary, Elsevier Science Publishers, LTD, Essix England, 1989, p. 151.*

Harcourt AP Dictonary of Science and Technology, "epoxy resin" online dictionary ate www.harcourt.com, one page, year 2002.*

Grant, Roger et al, eds, Grant and Hackh's Chemical Dictionary, fifth ed., McGraw–Hill Book Company, New York, N.Y., 1990, p. 216, "epoxy" "e. resins".*

Encyclopedia of Polymer Science and Engineering, vol. 6, "EPOXY RESINS", A Wiley–Interscience publication, John Wiley & Sons, Inc, 1985, pp. 322–341.*

* cited by examiner

*Primary Examiner*—Cynthia Hamilton
(74) *Attorney, Agent, or Firm*—Foley & Lardner

(57) ABSTRACT

The invention relates to a recording material sensitive to IR radiation and having a substrate, a primer layer, an IR-absorbing layer and a silicone layer. The primer layer includes a mixture of an unmodified epoxy resin, an organic polymer having functional groups and a crosslinking agent which reacts with the epoxy resin and the functional groups of the organic polymer. The primer layer preferably contains at least one pigment, in particular inorganic pigments. For the production of a printing plate for waterless offset printing, the recording material is exposed imagewise to IR radiation and is then freed from the ablated layer components by washing with water or an aqueous solution. Preferably the radiation is IR laser radiation. The primer layer according to the invention results in particularly good adhesion of the IR-absorbing layer to the substrate without hindering the removal of the exposed parts of the IR-absorbing layer during development.

28 Claims, No Drawings

RADIATION-SENSITIVE RECORDING MATERIAL FOR THE PRODUCTION OF WATERLESS OFFSET PRINTING PLATES

BACKGROUND OF THE INVENTION

1. Field of the Invention

The present invention relates to a recording material which is digitally imagable with IR radiation. The recording material includes an aluminum substrate, a primer layer, a layer absorbing infrared radiation and a silicone layer. The present invention further relates to a process for producing a printing plate for waterless offset printing from the recording material.

2. Description of the Related Art

The recording materials from which waterless offset printing plates can be produced are known in the art. German Patent Publication No. 25 12 038-B describes a negative-working material having a substrate for accepting a printing ink, a layer containing particles absorbing laser energy, nitrocellulose, a crosslinkable resin and a crosslinking agent, and a silicone layer repelling printing ink. In the case of exposure to laser radiation, the absorbing layer is destroyed in the exposed parts so that the silicone layer present on top loses its adhesion and can be removed, together with the residues of the absorbing layer, by means of an organic solvent. To develop the plate, it is then heated to about 200° C. to cure the crosslinkable resin and improve the adhesion of the silicone layer in the unexposed parts. The German Patent Publication also mentions an insulating layer which includes an oleophilic or ink-accepting resin. The insulating layer can be arranged between a highly heat-conducting metallic substrate and the IR-absorbing layer. According to the German Patent Publication, the type of resin is not critical. It is possible to use any oleophilic resins which are usual in the area of lithographic printing. Phenol- and cresol-formaldehyde resins, vinyl resins, alkyd resins, polyester resins, polyamides, polyvinyl acetate, polyvinyl chloride (PVC), polyvinylidene chloride (PVDC), polystyrene and polyethylene are mentioned. However the stability of the plate during printing without a fountain solution and the print run achievable thereby are insufficient in spite of the heat-curing of the IR-absorbing layer.

European Patent Publication No. 802 067-A describes a recording material for the production of waterless offset printing plates which includes a substrate, a heat-insulating layer, a heat-sensitive layer and a top layer for repelling printing ink. The recording material is distinguished by the fact that the heat-insulating layer, the heat-sensitive layer and the laminate formed from the two layers each have an initial modulus of elasticity of from 5 to 100 kgf/mm$^2$ and a 5% tensile stress of from 0.05 to 5 kgf/mm$^2$ (kgf=kg force=kp). The substrate is, for example, a degreased 0.24 mm thick aluminum foil. The heat-insulating layer can be produced by applying a mixture of polyurethane resin, blocked isocyanate, epoxy-phenol-urea resin, dibutyltin diacetate, Victoria Purple BOH naphthalenesulfonic acid in dimethylformamide to the substrate and then carrying out drying. The weight of the insulating layer is then 5 g/m$^2$. A mixture of nitrocellulose, carbon black, polyurethane, modified epoxy resin, epoxyacrylate and diethylenetriamine in methyl isobutyl ketone can then be applied to the dried layer, and drying can then be carried out for 1 min (layer weight: 2 g/mm$^2$). The top layer consists of an RTV-2 silicone rubber of the addition type.

European Patent Publication No. 763 424-A discloses a process for the production of an offset printing plate for printing in the absence of water. In the process, a material is used which comprises a substrate, a layer which converts laser beams into heat and a layer which repels printing ink. A further layer which, for example, improves the acceptance of the printing ink can be arranged between the substrate and the layer which absorbs laser beams. This further layer includes particular organic polymers, such as, acrylic, methacrylic, styrene or vinyl ester polymers, polyesters or polyurethanes.

The recording material for waterless offset printing plates according to European Patent Publication 764 522-A, which recording material is digitally imagable with IR laser beams, includes a substrate, an IR-absorbing layer and a silicone layer on top. A primer layer may also be present between substrate and IR-absorbing layer. The primer layer contains no IR-absorbing carbon black particles, but may include other pigments or dyes which impart greater contrast to the image produced by exposure to laser radiation. In addition, the primer layer reduces the flow of heat away from the IR-absorbing layer and into the substrate.

European Patent Publication No. 755 781-A relates to a recording material for waterless offset printing plates which includes a thin metal layer which absorbs IR laser beams and is ablated thereby.

WO 97/00175 discloses a recording material for offset plates printing in the absence of water, which material contains an oleophilic substrate, a layer which absorbs IR radiation and is preferably oleophilic and a preferably oleophobic top layer which is ablated by IR radiation.

SUMMARY OF THE INVENTION

One object of the invention is to overcome the disadvantages of the known art. Accordingly, there has been provided according to one aspect of the present invention a recording material sensitive to IR radiation which includes a substrate, a primer layer formed over the substrate, an IR-absorbing layer formed over the primer layer, and a silicone layer formed over the IR-absorbing layer, wherein the primer layer includes a mixture of (i) an unmodified epoxy resin, (ii) an organic polymer having functional groups, and (iii) a crosslinking agent which reacts with the unmodified epoxy resin and the functional groups of the organic polymer. In one aspect of the invention, the functional groups of the organic polymer are selected from hydroxyl and carboxyl groups. In another aspect of the invention, the organic polymer having functional groups is a fatty acid-modified, oven-drying or air-drying epoxy resin, a partially acetalated polyvinyl alcohol or an acrylic resin containing hydroxyl groups.

In a preferred aspect, the unmodified epoxy resin is present from about 2 to about 94.0% by weight, preferably form about 2.5 to about 80% by weight, most preferably from 2.5 to about 49% by weight, based on the total weight of the nonvolatile components of the primer layer. In another aspect of the invention, the weight ratio of unmodified epoxy resin to the organic polymer having functional groups is from about 1:36 to 89:1, preferably from about 1:8 to 8:1.

In another aspect of the invention, the crosslinking agent is present from about 5 to about 35% by weight, preferably from about 10 to 30% by weight, based on the total weight of the nonvolatile components of the primer layer.

In another aspect of the invention, the primer layer further includes at least one finely divided pigment. The pigment may include inorganic pigments, such as $SiO_2$, $Al_2O_3$, $ZrO_2$ and $TiO_2$ pigments. In a preferred aspect, the pigment is present from about 1 to 40% by weight, more preferably from about 5 to 30% by weight, based on the total weight of the nonvolatile components of the primer layer.

In another aspect of the invention, the substrate may be a degreased sheet or foil or aluminum or of an aluminum alloy, which has been bright rolled or pretreated in simple processes.

In another aspect of the invention, the IR-absorbing layer includes (a) a component which converts IR radiant energy into heat, (b) a polymeric binder which undergoes thermal degradation or decomposition under the action of the heat generated from the IR radiation; and (c) a crosslinking resin and/or a crosslinking agent. The weight of the IR absorbing layer is preferably from about 0.1 to about 4 g/m$^2$, more preferably from about 0.2 to about 3.0 g/m$^2$, and most preferably from about 0.5 to about 1.5 g/m$^2$.

In another aspect of the invention, the silicone layer includes an unvulcanized condensation silicone rubber, and the weight of the silicone layer is from about 1 to about 5 g/m$^2$, more preferably from about 1.2 to about 3.5 g/m$^2$, and most preferably from about 1.5 to about 3 g/m$^2$. In yet another aspect of the invention, a plastic film may be formed over the silicone layer.

It is another object of the invention to provide a process for the production of a printing plate for waterless offset printing, which includes imagewise exposing a recording material to IR radiation, and freeing the plate of ablated layer components by contacting the plate with water or an aqueous solution, wherein the recording material includes a substrate, a primer layer formed over the substrate, an IR-absorbing layer formed over the primer layer, and a silicone layer formed over the IR-absorbing layer, wherein the primer layer includes a mixture of an unmodified epoxy resin, an organic polymer having functional groups, and a crosslinking agent which reacts with the unmodified epoxy resin and the functional groups of the organic polymer.

Further objects, features and advantages of the present invention will be readily apparent to those skilled in the art from the detailed description which follows.

DETAILED DESCRIPTION OF THE PREFERRED EMBODIMENTS

In the following detailed description, reference is made to certain illustrative embodiments in which the invention may be practiced. These embodiments are described in sufficient detail to enable those skilled in the art to practice the invention, and it is to be understood that other embodiments may be utilized, and that changes may be made without departing from the spirit and scope of the present invention.

The present invention relates to a recording material which is digitally imagable with IR radiation and includes—in this order—a substrate, a primer layer, an IR-absorbing layer and a silicone layer, wherein the primer layer includes a mixture of (A) an unmodified epoxy resin, (B) an organic polymer having functional groups and (C) a crosslinking agent which reacts with the unmodified epoxy resin and the functional groups of the organic polymer.

The unmodified epoxy resin has no or substantially no further reactive groups apart from secondary hydroxyl groups and residual epoxy groups. Specifically, the unmodified epoxy resin has no or substantially no ester, acetal or carboxyl groups. The unmodified epoxy resin preferably contains no carbon chains having more than three aliphatic carbon atoms. Particularly suitable unmodified epoxy resins based on epichlorohydrin and bisphenolpropane (=bisphenol A) are available, for example, under the name BECKOPOX® from Vianova Resins GmbH & Co. KG. The unmodified epoxy resin is present in an amount from about 0.5 to about 95% by weight, preferably from about 2 to about 80% by weight, most preferably from about 5 to about 70% by weight, based on the total weight of the nonvolatile components of the primer layer. The weight ratio of unmodified epoxy resins to the organic polymers having functional groups is preferably in the range of from about 1:36 to about 89:1, most preferably from about 1:8 to about 8:1.

The functional groups of the organic polymer (B) are preferably hydroxyl and/or carboxyl groups. In contrast to the unmodified epoxy resin, this polymer generally contains chains of more than 3, preferably more than 12, aliphatic carbon atoms. The organic polymer (B) may be, for example, a vinyl polymer having a main chain including many (i.e. 20 or more) aliphatic carbon atoms or a polymer which contains pendant or terminal aliphatic radicals having preferably more than 8, most preferably more than 12, carbon atoms in a chain. Particularly suitable organic polymers (B) having functional groups are fatty acid-modified, oven-drying or air-drying epoxy resins, in particular epoxy resins based on bisphenol A, available under the name DUROXYN® from Vianova Resins GmbH & Co. KG, acetalated polyvinyl alcohols, especially polyvinyl butyrals (e.g. MOWITAL B® from Clariant GmbH), or hydroxyl-containing acrylic resins (e.g. MACRYNAL® from Vianova GmbH & Co. KG). The modification of the epoxy resins is achieved by esterification with a long-chain, saturated or unsaturated ($C_{12}$–$C_{26}$)fatty acid or a mixture of such fatty acids. The proportion of the fatty acid modification is from about 20 to about 80% by weight, preferably from about 30 to about 70% by weight, most preferably from about 40 to about 60% by weight, based the total weight of the fatty acid-modified epoxy resin.

The substrate according to the present invention generally includes metal or a metal alloy. A preferred substrate of this type is a degreased sheet or foil of aluminum or of an aluminum alloy, which has been bright rolled or pretreated in simple processes, such as, for example, by pickling or wet brushing. Aluminum substrates electrochemically pretreated in complicated processes are by no means essential for the recording material according to the invention. A chemical pretreatment, for example with silane adhesion promoters, is however possible. The primer layer results not only in improved adhesion but at the same time also in particularly high heat insulation.

The primer layer permanently and fixedly anchors the layer present on top and sensitive to IR radiation to the metallic substrate. The primer layer further contains a curing agent or crosslinking agent. The curing agent or crosslinking agent may be any polyfunctional, low molecular weight compound which can react with the reactive groups, in particular with the hydroxyl groups, of the unmodified epoxy resin and of the organic polymer. Formaldehyde adducts which are derived from urea, melamine or benzoguanamine, and completely or partially etherified formaldehyde-amine adducts are particularly suitable for this purpose. Specific examples of these compounds include, in particular, melamine-formaldehyde adducts partially or completely etherified with methanol, ethanol, propanol or butanol. These adducts are available under the name MAPRENAL® from Vianova Resins GmbH or under the name CYMEL® from Cytec. Polyisocyanates and aliphatic or aromatic polyamines are also suitable as the curing agent or crosslinking agent. The amount of the crosslinking agent is preferably from about 5 to about 35% by weight, more preferably from about 10 to about 30% by weight, based on the total weight of the nonvolatile components of the layer. The curing agent or crosslinking agent generally also reacts with the organic polymer (B) having functional groups. The curing effected by crosslinking is carried in the presence of organic acids, such as, for example, phosphoric acid derivatives or para-toluenesulfonic acid. The amount of the acid is preferably from about 0.5 to about 4% by weight, based on the total weight of the nonvolatile components of the primer layer. To be able to apply the primer layer uniformly, the primer layer preferably further contains pigments in finely divided form. Particular pigments are inorganic pigments, such as, for example, $SiO_2$, $Al_2O_3$, $ZrO_2$ or $TiO_2$ pigments. The mean diameter of the pigment particles is generally less than 10 $\mu$m, preferably less than 1 $\mu$m. In a particularly preferred embodiment, the pigment particles are predispersed in the fatty acid-modified epoxy resin. The pigments may be present in the primer layer in an amount from about 1 to about 40% by weight, preferably from about 5 to about 30% by weight, based on the total weight of the nonvolatile components of the primer layer. The primer layer may also contain conventional additives which result in more uniform leveling of the layer (so-called leveling agents) or help to achieve leveling of the primer layer, so that the layer can be more easily applied. For example, silicone oils, which are available under the name EDAPLAN®, and surfactants and/or addition promoters may be included. The amount of these additives is generally not more than 10% by weight, preferably not more than 5% by weight, based on the total weight of the nonvolatile components of the primer layer. In a preferred embodiment, crosslinking agents, pigments and additives together account for an amount of up to about 50% by weight, based on the total weight of the layer. The weight of the primer layer is generally from about 0.5 to about 10 g/m$^2$, preferably from about 1 to about 5 g/m$^2$, most preferably from about 2 to about 4 g/m$^2$.

Pigments or dyes may be optionally contained in the IR-absorbing layer where the pigments or dyes absorb laser beams having a wavelength in the infrared range (especially in the range of from about 700 to about 1200 nm). Here, the pigments are also intended to include carbon black. Suitable IR absorbers are known to those having ordinary skill in the art and are described in J. Fabian et al., Chem. Rev. 92 [1992] 1197. Pigments which contain metals, metal oxides, metal sulfides, metal carbides or similar metal compounds are also suitable for use in the present invention. Finely divided metallic elements of main groups III to V and of subgroups I, II and IV to VIII of the Periodic Table, such as Mg, Al, Bi, Sn, In, Zn, Ti, Cr, Mo, W, Co, Ir, Ni, Pd, Pt, Cu, Ag, Au, Zr or Te, are preferred. Suitable IR-absorbing components are those such as metal phthalocyanine compounds, anthraquinones, polythiophenes, polyanilines, polyacetylenes, polyphenylenes, polyphenylene sulfides and polypyrroles. To avoid adversely affecting the resolution unnecessarily, the absorbing pigment particles should preferably have a mean diameter of not more than 30 $\mu$m. Furthermore, the amount of the IR-absorbing component is generally from about 2 to about 80% by weight, preferably from about 5 to about 57% by weight, based on the total weight of the nonvolatile components of the layer. The IR-absorbing layer may furthermore contain at least one polymeric, organic binder. Binders which decompose spontaneously under the action of heat are particularly advantageous. These self-oxidizing binders include, in particular, nitrocellulose. It is also possible to use a non-self-oxidizing polymer which undergoes indirect thermally induced decomposition with the formation of gaseous or volatile cleavage products. Non-limiting examples of these include cellulose ethers and cellulose esters (such as, for example, ethylcellulose and cellulose acetate), (meth)acrylate polymers and copolymers (such as, for example, poly(methyl methacrylate), poly(butyl acrylate), poly(2-hydroxyethyl methacrylate), lauryl acrylate/methacrylic acid copolymers), polystyrene, poly(methylstyrene), vinyl chloride/vinyl acetate copolymers, vinylidene chloride/acrylonitrile copolymers, polyurethanes, polycarbonates, polysulfones, polyvinyl alcohol and polyvinylpyrrolidone. The polymers capable of direct or indirect thermal decomposition are not required in every case, and thus other film-forming polymers may also be used. This is so if the IR-absorbing component already forms sufficiently volatile products on exposure to radiation. Carbon black, for example, undergoes combustion when IR laser beams strike it and accordingly gives gaseous combustion products. It may be used either in combination with thermally decomposable raw materials or alone. The amount of the binders in the IR-absorbing layer is generally from about 10 to about 95% by weight, preferably from about 20 to about 80% by weight, based on the total weight of the nonvolatile components of the layer.

In addition, the IR-absorbing layer may also contain compounds which crosslink the binder. The type of crosslinking agents depends on the chemical functionality of the binder (see, S. Paul, Crosslinking Chemistry of Surface Coatings in Comprehensive Polymer Science, Volume 6, Chapter 6, page 149). Nitrocellulose may be crosslinked, for example, with melamine or a di-, tri- or polyisocyanate and thus cured. The amount of the crosslinking agent or agents in the IR-absorbing layer may be from 0 to about 30% by weight, preferably from about 3 to about 20% by weight, most preferably from about 5 to about 15% by weight, based on the total weight of the nonvolatile components of the IR-absorbing layer.

The IR-absorbing layer can moreover contain compounds which decompose under the action of heat and/or IR beams. The IR-absorbing layer can also contain compounds which decompose by chemical reaction to form chemically active species (in particular acids) which in turn result in cleavage or decomposition of the polymeric, organic binder. This in turn results in volatile cleavage or decomposition products. Binders which contain tert-butoxycarbonyl groups give, for example, $CO_2$ and isobutene, when acid acts on them. Furthermore, the IR-absorbing layer may contain compounds which form low molecular weight, gaseous or at least volatile cleavage products (see, Encycl. Polym. Sci. Eng., Vol. 2, page 434, which is herein incorporated by reference.). Non-limiting examples of such compounds include diazonium salts, azides, bicarbonates and azobicarbonates. The IR-absorbing layer may also contain conventional additives, such as, stabilizers for increasing the shelf life, plasticizers, catalysts for initiating the crosslinking reaction, dulling agents, additional dyes, surfactants, leveling agents or other assistants for improving stability, processing or reprographic quality. The amount of these additives is generally from 0 to about 50% by weight, preferably from about 5 to about 30% by weight, based on the weight of the nonvolatile components of the IR-absorbing layer. The weight of the IR-absorbing layer all together is generally from about 0.1 to about 4 g/m$^2$, preferably from about 0.2 to about 3 g/m$^2$, most preferably from about 0.5 to about 1.5 g/m$^2$.

In principle, any unvulcanized silicone rubber which is sufficiently ink-repellant to permit printing without fountain solution is suitable for use as the silicone layer present over the IR-absorbing layer. In accordance with the definition by Noll, "Chemie und Technologie der Silikone", Verlag Chemie, 1968, page 332, the term "unvulcanized silicone rubber" is to be understood here as meaning a high molecular weight, especially linear diorganopolysiloxane. On the other hand, the term "silicone rubber" is used for the crosslinked or vulcanized products. In every case, a solution of unvulcanized silicone rubber is applied to the radiation-sensitive layer, dried and thus crosslinked. Suitable solvents are, for example, isoparaffin mixtures (e.g. ISOPAR® from Exxon) or ketones, such as butanone.

The unvulcanized silicone rubber may be one-part or multicomponent unvulcanized rubbers. Examples of these are known to those skilled in the art and described in German Patent Publication No. 23 50 211-A, No. 23 57 871-A and No. 23 59 102-A. Condensation silicone rubbers, for example one-component silicone rubbers (RTV-1), are preferred. They are typically based on polydimethylsiloxanes which carry hydrogen atoms, acetyl, oxime, alkoxy or amino groups or other functional groups at the ends. The methyl groups in the chain can be replaced by other alkyl groups, haloalkyl groups or unsubstituted or substituted aryl groups. The terminal functional groups are readily hydrolyzable and cure in the presence of moisture in a time span of from a few minutes to a few hours.

The multicomponent unvulcanized silicon rubbers are crosslinkable by addition or condensation. The addition-crosslinkable types generally contain two different polysiloxanes. A first polysiloxane is present in an amount of from about 70 to about 99% by weight and has alkylene groups (specifically vinyl groups) which are bonded to silicon atoms of the main chain. The second polysiloxane is present in an amount of from about 1 to about 10% by weight. Hydrogen atoms are directly bonded to silicon atoms therein. The addition reaction then takes place in the presence-of from about 0.0005 to about 0.002% by weight of a platinum catalyst at temperatures of more than 50° C. Multicomponent unvulcanized silicone rubbers have the advantage in that they crosslink very rapidly at relatively high temperature (about 100° C). The time within which they can be processed, the so-called "pot life", is on the other hand frequently relatively short.

The mixtures crosslinkable by condensation contain diorganopolysiloxanes having reactive terminal groups, such as hydroxyl or acetoxy groups. These are crosslinked with silanes or organosiloxanes in the presence of catalysts.

The crosslinking agents are present in an amount of from about 2 to about 10% by weight, based on the total weight of the silicone layer. The catalysts are present in an amount of from about 0.01 to about 6% by weight, once again based on the total weight of the silicone layer. These combinations, too, react relatively rapidly and therefore have only a limited pot life.

The silicone layer may contain further components. These may serve for additional crosslinking, better adhesion, mechanical strengthening or coloring. The further components are present in an amount of not more than about 10% by weight, preferably not more than about 5% by weight, based on the total weight of the silicone layer.

A preferred mixture comprises hydroxyl-terminated polydimethylsiloxanes, a silane crosslinking component (in particular a tetra- or trifunctional alkoxy-, acetoxy-, amido-, amino-, aminoxy-, ketoximino- or enoxysilane), a crosslinking catalyst (in particular an organotin or an organotitanium compound) and optionally further components (in particular organopolysiloxane compounds having Si-H bonds, silanes having adhesion-improving properties, reaction inhibitors, fillers and/or dyes). The silane crosslinking components and the reactions occurring during the crosslinking are described by J. J. Lebrun and H. Porte in "Comprehensive Polymer Science", Vol. 5 [1989] 593–609, which is herein incorporated by reference.

After application as a layer, the unvulcanized silicone rubbers are crosslinked in a manner known to those skilled in the art either by the presence of moisture or the unvulcanized silicone rubbers undergo self-crosslinking at room temperature or at elevated temperature to a vulcanized silicone rubber essentially insoluble in organic solvents. The weight of the prepared silicone layer is in general from about 1 to about 5 g/m$^2$, preferably from about 1.2 to about 3.5 g/m$^2$, most preferably from about 1.5 to about 3 g/m$^2$.

To protect the recording material from mechanical and/or chemical influences during storage, a plastic film may be laminated with the silicone layer. Polyethylene films are particularly suitable. The film is removed before the imagewise exposure of the device.

The recording material according to the invention is produced by customary methods known to those persons skilled in the art. The components of the primer layer are generally dissolved or dispersed in an organic solvent or solvent mixture and applied to the substrate, which may or may not have been pretreated. Suitable organic solvents include ketones, such as butanone (i.e., methyl ethyl ketone) or cyclohexanone, ethers, such as tetrahydrofuran, (poly) glycol ethers and glycol ether esters, such as ethylene glycol monomethyl ether or ethylene glycol monoethyl ether, propylene glycol monomethyl ether or propylene glycol monoethyl ether, propylene glycol monomethyl ether acetate, diethylene glycol monoethyl ether or triethylene glycol monomethyl ether, or esters, such as ethyl lactate or butyl lactate, as well as hydrocarbons, such as xylene or Solvent Naphtha. Coating itself can be effected by pouring on, spin-coating or similar known methods. The solvent is then removed by drying. For this purpose, the material is expediently heated to a temperature in the range from about 80 to about 130° C. for from 1 to about 3 min. As a result of the heating, the crosslinking reaction is simultaneously accelerated.

The components of the layer sensitive to IR radiation are dissolved or dispersed in an organic solvent or solvent mixture in an analogous manner. The solution or dispersion is then applied to the primer layer and dried. The drying conditions may be chosen as suitable for the production of the primer layer.

The unvulcanized silicone rubber layer is then applied to the layer sensitive to IR radiation and dried and crosslinked, as described above. Suitable drying conditions may be, for example, 1 min at 120° C.

The imagewise exposure of the recording material is typically carried out by exposure to radiation having a wavelength of from about 700 to about 110 nm, i.e., to IR radiation. Imaging is generally effected digitally, i.e., without a photographic negative, in a suitable exposure apparatus. The apparatus may be, for example, an internal-drum or external-drum exposure unit or a flat-plate exposure unit. IR laser diodes, YAG lasers, preferably Nd-YAG lasers, or the like may serve as radiation sources. In the exposed parts, the radiation-sensitive layer decomposes (typically with the formation of gaseous decomposition products), so that the silicone layer present on top is no longer firmly anchored thereon. The silicone layer itself absorbs virtually no IR radiation and, as such, cannot be ablated by IR radiation. The exposed recording material is then treated with water or an aqueous solution in a known apparatus customary for waterless printing plates. Expediently, this process may be mechanically supported by brushing or in another manner. The silicone layer in the parts affected by the IR radiation is then removed. Pre-swelling of the exposed recording material may, if desired, be dispensed with. The components of the silicone layer which were removed during development can be separated off by filtration. The problem of the disposal of spent developer solutions contaminated with chemicals therefore does not arise.

The printing plates for waterless offset printing which are produced from the negative-working recording material according to the invention have high resolution and at the same time permit prolonged print runs.

The examples which follow serve for illustrating the invention. The examples are not to be construed as limiting of the invention, merely illustrative thereof. In the examples, "pbw" represents "part(s) by weight". Percentages are percentages by weight, unless stated otherwise.

EXAMPLES 1 TO 8

The mixtures described in Table 1 (the numerical data therein are pbw) were applied by spin-coating to a degreased bright rolled aluminum sheet having a thickness of 0.3 mm. The coating thus applied was then dried for 2 min in a forced-draft oven at 120° C.

| | |
|---|---|
| 56.7 g | EFWEKO NC 118/2 ® from Degussa AG (mixture of 18% of High Color Channel (HCC) carbon black, 56% of collodium wool (dinitro-cellulose), 22% of plasticizer and 4% of additive); 20% strength dispersion in ethylene glycol monomethyl ether, |
| 6.0 g | modified siloxane/glycol copolymer (EDAPLAN LA 411 ® from Münzing Chemie GmbH, Heilbronn), 1% strength solution in butanone, |
| 3.0 g | polyisocyanate crosslinking agent (about 31% of NCO groups; DESMODUR VKS 20 F ® from Bayer AG), 20% strength solution in butanone, |
| 164.26 g | butanone and |
| 69.84 g | ethylene glycol monomethyl ether (DOWANOL PMA ® from Dow Chemical) |

was applied to the dried primer layer and dried for 2 min at 120° C. in forced-draft oven. The layer sensitive to IR radiation then had a weight of 0.92 g/m$^2$.

In Examples 5 to 8, a mixture of:

| | |
|---|---|
| 4.97 g | nitrocellulose (contains 18% of dibutyl phthalate as plasticizer; Walsroder NC-Chips E 950 from Wolff Walsrode AG), |
| 4.13 g | polyisocyanate crosslinking agent (about 31% of NCO groups; ® Desmodur VKS 20 F from Bayer AG), 20% strength solution in butanone, |
| 64.22 g | of a dispersion of 7.51 g of LCF (Low Color Furnace) black (special black 100 from Degussa), 3.22 g of nitrocellulose (Walsroder NC-Chips E 950) and 53.4 g of ethylene glycol monomethyl ether (DOWANOL PMA ®), |
| 8.25 g | of a modified siloxane/glycol copolymer (EDAPLAN LA 411 ® from Münzing Chemie GmbH, Heilbronn), 1% strength solution in butanone, |
| 201.93 g | butanone and |
| 266.60 g | ethylene glycol monomethyl ether |

was applied to the primer layer and dried as described. The weight of the dried layer sensitive to IR radiation was 0.96 g/m$^2$. The silicone layer applied to this layer was identical to that in the comparative example and in Examples 1 to 4.

A mixture of:

| | |
|---|---|
| 23.79 g | of hydroxyl-terminated polydimethylsiloxane having a viscosity of about 5000 mP · s, |
| 2.54 g | tris(methylethylketoximino)vinylsilane ($H_2C{=}CH{-}Si[{-}O{-}N{=}C(CH_3){-}C_2H_5]_3$), |
| 13.50 g | of a 1% strength solution of dibutyltin acetate in an isoparaffinic hydrocarbon mixture having a boiling range from 117 to 134° C. (catalyst C80 from Wacker Chemie GmbH), |
| 0.54 g | 3-(2-aminoethyl)aminopropyltrimethoxysilane, |
| 177.74 g | of an isoparaffinic hydrocarbon mixture having a boiling range from 117 to 134° C. (ISOPAR E ® from Exxon) and |
| 81.90 g | butanone |

was then applied by spin-coating to the layer sensitive to IR radiation. The layer thus produced was dried for 2 min at 120° C. The weight of the dried silicone layer was then 3.1 g/m$^2$ and the thickness of the layer was accordingly about 3 μm.

The recording material produced in this manner was then applied to the roller of an external-drum exposure unit and exposed to the IR radiation of an Nd-YAG laser which emits radiation having a wavelength of 1064 nm at a power of 100 mW and whose spot size was 20 μm. The energy reaching the plate was set at 350 mJ/cm$^2$ by rotating the drum. At the same time, the laser was moved so that lines were written into the material. The material digitally imaged in this manner was then treated with water at room temperature and brushed in a unit usually used for developing waterless printing plates, in order to remove the layer sensitive to IR radiation and those parts of the silicone layer which are present thereon, in the parts effected by the radiation. The sensitivity was determined from the width of the lines produced in the material. The closer the line width to the diameter of the laser beam (20 μm) used for the exposure, the higher is the sensitivity.

The printing plate obtained from the recording material according to the invention had a high resolution and high stability during printing, so that relatively long print runs were also possible.

TABLE 1

| Component | Examples (C = Comparative Example) | | | | | | | | |
|---|---|---|---|---|---|---|---|---|---|
| | C | 1 | 2 | 3 | 4 | 5 | 6 | 7 | 8 |
| Duroxyn EF 900 (60% xylene) | 14.63 | 14.00 | 13.38 | 12.13 | 9.63 | 19.01 | — | — | — |
| Macrynal SM 540 (60%) | — | — | — | — | — | — | 19.01 | — | — |
| Mowital B 30 H (15% MEK) | — | — | — | — | — | — | — | 40.95 | — |
| Carboset 526 | — | — | — | — | — | — | — | — | 7.02 |
| Cymel 303 | 1.50 | 1.50 | 1.50 | 1.50 | 1.50 | 1.95 | 1.95 | 1.05 | 1.20 |
| Beckopox EP 301 | — | 0.38 | 0.75 | 1.50 | 3.00 | 5.85 | 5.85 | 3.15 | 3.60 |
| pTosOH (10% PMA) | 1.50 | 1.50 | 1.50 | 1.50 | 1.50 | 1.95 | 1.55 | 1.05 | 1.20 |
| Kronos 2059 - Dispersion | 11.25 | 11.25 | 11.25 | 11.25 | 11.25 | — | — | — | — |
| Edaplan LA 411 (10% PMA) | 0.75 | 0.75 | 0.75 | 0.75 | 0.75 | 0.98 | 0.98 | 0.53 | 0.60 |
| Butanone | 75.15 | 75.40 | 75.65 | 76.15 | 77.15 | 78.30 | 78.30 | 48.89 | 82.80 |
| Dowanol PMA | 43.23 | 45.23 | 45.23 | 45.23 | 45.23 | 41.96 | 41.96 | 54.38 | 53.58 |
| Layer weight (g/m$^2$) | 2.1 | 2.0 | 2.0 | 2.1 | 2.0 | 3.4 | 3.5 | 2.8 | 2.8 |
| Line width (μm) | —)* | 13.9 | 12.2 | 12.6 | 11.8 | 14.6 | 12.9 | 10.8 | 13.7 |

)*Large parts of the total layer are removed during brushing

Explanations for Table 1

DUROXYN EF 900®: Epoxy resin based on epichlorohydrin and bisphenol A, esterified with fatty acid based on dehydrated castor oil, 58% of epoxy resin and 42% of fatty acid modification; dynamic viscosity (DIN 53 015; 23° C.): from 650 to 950 mPa·s; a 60% strength solution in xylene was used MACRYNAL SM 540®: acrylic resin having units of 2-hydroxyethyl acrylate or methacrylate, a hydroxyl number (DIN 53 240) of from 40 to 50, a hydroxyl group content (based on solids) of about 1.4% and a dynamic viscosity (diluted to 50% with xylene; DIN 53 018/ISO 3219; 23° C.) of from 300 to 550 mPa·s; a 60% strength solution in xylene/butyl acetate was used (mixing ratio: 9 pbw to 1 pbw)

MOWITAL B 30 H®: polyvinyl butyral having from 75 to 78% of vinyl acetal units, from 1 to 4% of vinyl acetate units and from 18 to 21% of vinyl alcohol units CARBOSET 526®: thermoplastic polyacrylate (molecular weight $M_W$ of about 200,000; acid number about 100; glass transition temperature $T_g$ about 70° C.; manufacturer: B. F. Goodrich)

CYMEL 303®: hexamethoxylmethylmelamine

BECKOPOX EP 301®: unmodified epoxy resin obtained from epichlorohydrin and bisphenol A KRONOS 2059®: $TiO_2$ pigment (a 50% strength dispersion of DUROXYN EF 900® and KRONOS 2059 (1:1) in DOWANOL® PMA was used)

pTosOH: para-toluenesulfonic acid

MEK: methyl ethyl ketone or butanone.

EXAMPLES 9 TO 18

The mixtures described in Table 2 (the numerical data therein are pbw) were applied by spin-coating to a degreased bright rolled aluminum sheet having a thickness of 0.3 mm. The coating thus applied was once again dried for 2 min in a forced-draft oven at 120° C.

A mixture of:

| | | |
|---|---|---|
| 1.57 | g | nitrocellulose (contains 18% of dibutyl phthalate as a plasticizer; Walsroder NC-Chips E 950 from Wolff Walsrode AG), |
| 2.75 | g | of a polyisocyanate crosslinking agent (about 31% of NCO groups; DESMODUR VKS 20 F ® from Bayer AG), 20% strength solution in butanone, |
| 59.03 | g | of a dispersion of 6.20 g of LCF (Low Color Furnace) black (special black 250 from Degussa), 2.66 g of nitrocellulose (Walsroder NC-Chips E 950) and 50.18 g of ethylene glycol monomethyl ether (DOWANOL ® PMA), |
| 5.50 | g | modified siloxane/glycol copolymer (EDAPLAN LA 411 ® from Münzing Chemie GmbH, Heilbronn), 1% strength solution in butanone, |
| 207.96 | g | butanone and |
| 273.22 | g | ethylene glycol monomethyl ether |

was then applied to the dried primer layer and dried for 2 min at 120° C. in a forced-draft oven. The layer sensitive to IR radiation then had a weight of 0.50 g/m$^2$.

A mixture of:

| | | |
|---|---|---|
| 36.44 | g | of a hydroxyl-terminated polydimethylsiloxane having a viscosity of about 6000 mP · s (CDS 6T from Wacker Chemie GmbH), |
| 2.56 | g | tris(methylethylketoximino)vinylsilane ($H_2C{=}CH{-}Si[{-}O{-}N{=}C(CH)_3 C_2H_5]_3$), |
| 20.00 | g | of a 1% strength solution of dibutyltin acetate in an isoparaffinic hydrocarbon mixture having a boiling range from 117 to 134° C. (ISOPAR E ® from Exxon), |
| 0.80 | g | 3-(2-aminoethyl)aminopropyltrimethoxysilane, |
| 302.20 | g | of an isoparaffinic hydrocarbon mixture having a boiling range from 117 to 134° C. (ISOPAR E ® from Exxon) and |
| 138.00 | g | butanone |

was then applied by spin-coating to the layer sensitive to IR radiation. The layer thus produced was dried for 1 min at 120° C. The weight of the dried silicone layer was then 2.2 g/m$^2$.

was applied by spin-coating to a degreased bright rolled aluminum sheet having a thickness of 0.3 mm. The coating thus applied was dried for 2 min in a forced-draft oven at 120° C. The layout then had a weight of 3.16 g/m$^2$.

TABLE 2

| | Examples | | | | | | | | | |
|---|---|---|---|---|---|---|---|---|---|---|
| Component | 9 | 10 | 11 | 12 | 13 | 14 | 15 | 16 | 17 | 18 |
| Duroxyn EF 900 (60% xylene) | 22.00 | 7.33 | 7.33 | 7.33 | 7.33 | 7.33 | 7.33 | 7.33 | 7.33 | 7.33 |
| Beckopox EP 301 | 6.27 | 6.27 | 6.27 | 6.27 | 6.27 | 6.27 | 6.27 | 6.27 | 6.27 | 6.27 |
| Cymel 303 | 2.20 | 2.20 | 2.20 | 2.20 | 2.20 | 2.20 | 2.20 | 2.20 | 2.20 | 2.20 |
| pTosOH (10% PMA) | 2.20 | 2.20 | 2.20 | 2.20 | 2.20 | 2.20 | 2.20 | 2.20 | 2.20 | 2.20 |
| Kronos 2310-Disp. (50%) | — | 17.60 | — | — | — | — | — | — | — | — |
| Kronos 2059-Disp. (50%) | — | — | 17.60 | — | — | — | — | — | — | — |
| Alcoa P 807-Disp. (50%) | — | — | — | 17.60 | — | — | — | — | — | — |
| Alcoa P 808-Disp. (50%) | — | — | — | — | 17.60 | — | — | — | — | — |
| Tosoh TZ-O-Disp. (50%) | — | — | — | — | — | 17.60 | — | — | — | — |
| Tosoh TZ-3Y-Disp. (50%) | — | — | — | — | — | — | 17.60 | — | — | — |
| Tosoh TZ-8Y-Disp. (50%) | — | — | — | — | — | — | — | 17.60 | — | — |
| Aerosil R972-Disp. (30%) | — | — | — | — | — | — | — | — | 29.33 | — |
| Kronos 2044-Disp. (40%) | — | — | — | — | — | — | — | — | — | 22.00 |
| Edaplan LA 411 (10% PMA) | 1.10 | 1.10 | 1.10 | 1.10 | 1.10 | 1.10 | 1.10 | 1.10 | 1.10 | 1.10 |
| Butanone | 106.80 | 106.80 | 106.80 | 106.80 | 106.80 | 106.80 | 106.80 | 106.80 | 106.80 | 106.80 |
| Dowanol PMA | 59.43 | 56.50 | 56.50 | 56.50 | 56.50 | 56.50 | 56.50 | 56.50 | 44.76 | 52.10 |

Explanations for Table 2:

ALCOA P 807/808®: $Al_2O_3$ pigment from Alcoa Chemie GmbH

TOSOH TZ-O/TZ-3Y/TZ-8Y®: $ZrO_2$ pigment from Tosoh Corporation, Japan

AEROSIL R 972®: $SiO_2$ pigment from Degussa AG

EXAMPLE 19

A mixture of:

| | | |
|---|---|---|
| 666.00 | g | BECKOPOX EP 301 ® (75% strength in xylene), |
| 810.00 | g | BECKOPOX EP 301 ®, |
| 270.00 | g | CYMEL 303 ®, |
| 270.00 | g | para-toluenesulfonic acid (10% strength in ethylene glycol monomethyl ether), |
| 2160.00 | g | $TiO_2$ pigment (KRONOS 2310 ®; 50% strength in ethylene glycol monomethyl ether), |
| 135.00 | g | modified siloxane/glycol copolymer (EDAPLAN LA 411 ®; 10% strength in ethylene glycol monomethyl ether), |
| 9180.00 | g | butanone and |
| 4509.00 | g | ethylene glycol monomethyl ether |

A mixture of:

| | | |
|---|---|---|
| 3.31 | g | nitrocellulose (contains 18% of dibutyl phthalate as a plasticizer; Walsroder NC-Chips E 950 from Wolff Walsrode AG), |
| 1.13 | g | hexamethoxymethylmelamine (Cymel 301 ®; 20% strength solution in butanone), |
| 0.45 | g | para-toluenesulfonic acid (10% strength in butanone), |
| 0.90 | g | of an IR-absorbing dye having an absorption maximum at about 820 nm (PRO-JET 830 ® from Zeneca Specialist Colors), |
| 2.25 | g | of modified siloxane/glycol copolymer (EDAPLAN LA 411 ® from Münzing Chemie GmbH, Heilbronn), 1% strength solution of butanone, |
| 83.77 | g | butanone and |
| 58.20 | g | ethylene glycol monomethyl ether |

was then applied to the primer layer thus produced and was dried for 2 min at 120° C. in a forced-draft oven. The layer sensitive to IR radiation then had a weight of 1.01 g/m$^2$.

A mixture of:

| | | |
|---|---|---|
| 27.75 | g | of a hydroxyl-terminated polydimethylsiloxane having a viscosity of about 5000 mP · s, |
| 2.96 | g | tris(methylethylketoximino)vinylsilane, |
| 15.75 | g | of a 1% strength solution of dibutyltin acetate in an isoparaffinic hydrocarbon mixture having a boiling range from 117 to 134° C. (catalyst C 80 from Wacker Chemie GmbH), |
| 0.63 | g | 3-(2-aminoethyl)aminopropyltrimethoxy-silane, |
| 277.36 | g | of an isoparaffinic hydrocarbon mixture having a boiling range from 117 to 134° C. (ISOPAR E ® from Exxon) and |
| 125.55 | g | butanone |

was then applied by spin-coating to the layer sensitive to IR radiation. The layer produced in this manner was then dried for 1 min at 120° C. The weight of the dried silicone layer was 2.51 g/m$^2$.

The recording material produced in this manner was exposed, on an external-drum exposure unit (40 revolutions per minute), to the radiation of IR laser diodes (830 mn; 10 watt output) and, after water-supported mechanical removal of the ablated layer residues, gave a crisp image of high resolution.

In the exemplary embodiments described, the storage elements or enclosures are always shown as substantially flat elements. However, it is also possible for enclosures of similar cross-sectional shape in their longitudinal extent to be shaped into a curved path as an arc or even into a ring. Furthermore, it is possible to arrange a plurality of accumulator elements in the form of a spiral, in which case the turns of the spiral are at a sufficient distance apart for the heat-transfer medium to flow through.

Similarly, the process described above is but one method of many that could be used. Accordingly, the above description is only illustrative of preferred embodiments which can achieve the features and advantages of the present invention. It is not intended that the invention be limited to the embodiments shown and described in detail herein. The invention is only limited by the scope of the following claims.

German Patent Application No. 199 08 528.5 filed on Feb. 26, 1999, including the specification, figures and abstract is expressly incorporated by reference in its entirety.

What is claimed as new and desired to be protected by Letters patent of the United States is:

1. A recording material sensitive to IR radiation comprising:

a substrate;

a primer layer formed over said substrate;

an IR-absorbing layer formed over said primer layer; and a silicone layer formed over said IR-absorbing layer wherein said primer layer, includes a mixture of (i) an unmodified epoxy resin, based on epichlorohydrin and bisphenolpropane, (ii) an organic polymer having functional groups, and (iii) a crosslinking agent which reacts with the unmodified epoxy resin and the functional groups of the organic polymer.

2. The recording material as set forth in claim 1, wherein the functional groups of the organic polymer are selected from hydroxyl and carboxyl groups.

3. The recording material as set forth in claim 1, wherein the organic polymer having functional groups is selected from the group consisting of a fatty acid-modified, oven-drying or air-drying epoxy resin, a partially acetalated polyvinyl alcohol and an acrylic resin containing hydroxyl groups.

4. The recording material as set forth in claim 1, wherein the unmodified epoxy resin is present from about 2 to about 94% by weight, based on the total weight of nonvolatile components of said primer layer.

5. The recording material as set forth in claim 1, wherein the unmodified epoxy resin is present from about 2.5 to about 80% by weight, based on the total weight of nonvolatile components of said primer layer.

6. The recording material as set forth in claim 1, wherein the unmodified epoxy resin is present from about 2.5 to about 49% by weight, based on the total weight of nonvolatile components of said primer layer.

7. The recording material as set forth in claim 1, wherein the weight ratio of unmodified epoxy resin to the organic polymer having functional groups is from about 1:36 to 89:1.

8. The recording material as set forth in claim 1, wherein the weight ratio of unmodified epoxy resin to the organic polymer having functional groups is from about 1:8 to 8:1.

9. The recording material as set forth in claim 7, wherein the amount of the crosslinking agent is from about 5 to about 35% by weight, based on the total weight of nonvolatile components of said primer layer.

10. The recording material as set forth in claim 7, wherein the amount of the crosslinking agent is from about 10 to 30% by weight, based on the total weight of nonvolatile components of said primer layer.

11. The recording material as set forth in claim 1, wherein the primer layer further includes at least one finely divided pigment.

12. The recording material as set forth in claim 11, wherein the at least one finely divided pigment includes inorganic pigments.

13. The recording material as set forth in claim 12, wherein the inorganic pigment is selected from the group consisting of $SiO_2$, $Al_2O_3$, $ZrO_2$ and $TiO_2$ pigments.

14. The recording material as set forth in claim 11, wherein the pigment is present from about 1 to 40% by weight, based on the total weight of nonvolatile components of the primer layer.

15. The recording material as set forth in claim 11, wherein the pigment is present from about 5 to 30% by weight, based on the total weight of nonvolatile components of the primer layer.

16. The recording material as set forth in claim 1, wherein the substrate comprises a degreased sheet or film of aluminum or of an aluminum alloy.

17. The recording material as set forth in claim 1, wherein the IR-absorbing layer includes:

a) a component which converts IR radiant energy into heat;

b) a polymeric binder which undergoes thermal degradation or decomposition under the action of the heat generated from the IR radiation; and c) a crosslinking resin and/or a crosslinking agent.

18. The recording material as set forth in claim 1, wherein the weight of the IR absorbing layer is from about 0.1 to about 4 $g/m^2$.

19. The recording material as set forth in claim 1, wherein the weight of the IR absorbing layer is from about 0.2 to about 3 $g/m^2$.

20. The recording material as set forth in claim 1, wherein the weight of the IR absorbing layer is from about 0.5 to about 1.5 $g/m^2$.

21. The recording material as set forth in claim 1, wherein the silicone layer includes an unvulcanized condensation silicone rubber.

22. The recording material as set forth in claim 1, wherein the weight of the silicone layer is from about 1 to about 5 $g/m^2$.

23. The recording material as set forth in claim 1, wherein the weight of the silicone layer is from about 1.2 to about 3.5 $g/m^2$.

24. The recording material as set forth in claim 1, wherein the weight of the silicone layer is from about 1.5 to about 3 $g/m^2$.

25. The recording material as set forth in claim 1, further comprising a plastic film formed over said silicone layer.

26. The recording material as set forth in claim 25, wherein said plastic film comprises a polyethylene film.

27. A process for the production of a printing plate for waterless offset printing, comprising:

imagewise exposing a recording material to IR radiation; and freeing the plate of ablated layer components by contacting said plate with water or an aqueous solution, wherein said recording material includes:

a substrate;

a primer layer formed over said substrate;

an IR-absorbing layer formed over said primer layer; and a silicone layer formed over said IR-absorbing layer wherein said primer layer includes a mixture of an unmodified epoxy resin, based on epichlorohydrin and bisphenolpropane, an organic polymer having functional groups, and a crosslinking agent which reacts with the unmodified epoxy resin and the functional groups of the organic polymer.

28. The process as set forth in claim 27, wherein said exposing step includes exposing said recording material to IR laser radiation.

* * * * *